(12) United States Patent
Oh et al.

(10) Patent No.: US 10,418,417 B1
(45) Date of Patent: Sep. 17, 2019

(54) MULTI-LEVEL SYNAPTIC WEIGHT DEVICE OF VERTICAL CROSS-POINT STRUCTURE IN THREE DIMENSION AND FABRICATION THEREOF

(71) Applicants: SK hynix Inc., Icheon-si (KR); POSTECH Research and Business Development Foundation, Pohang-si (KR)

(72) Inventors: Seungyeol Oh, Pohang-si (KR); In Kyeong Yoo, Yongin-si (KR); Hyunsang Hwang, Daegu (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/051,774

(22) Filed: Aug. 1, 2018

(30) Foreign Application Priority Data

Mar. 15, 2018 (KR) .................. 10-2018-0030166

(51) Int. Cl.
*G11C 13/00* (2006.01)
*H01L 27/24* (2006.01)
*H01L 45/00* (2006.01)
*G06N 3/08* (2006.01)

(52) U.S. Cl.
CPC .......... *H01L 27/2481* (2013.01); *G06N 3/08* (2013.01); *G11C 13/003* (2013.01); *H01L 27/2409* (2013.01); *H01L 27/2436* (2013.01); *H01L 45/1683* (2013.01); *G11C 13/0069* (2013.01); *G11C 2213/79* (2013.01); *H01L 45/06* (2013.01); *H01L 45/08* (2013.01); *H01L 45/1226* (2013.01); *H01L 45/146* (2013.01)

(58) Field of Classification Search
CPC .................................................. G11C 13/0069
USPC ......................................................... 365/148
See application file for complete search history.

(56) References Cited

U.S. PATENT DOCUMENTS 5,146,542 A      9/1992  Engeler
9,466,362 B2 *  10/2016  Yu ...................... G11C 13/0026

* cited by examiner

*Primary Examiner* — Jason Lappas (57) ABSTRACT

A multi-level synaptic weight device having a 3D vertical cross-point structure according to an embodiment includes a multi-level conductance structure configured to couple any one of multiple word lines to any one of multiple bit lines. The conductance structure may include a multiplexer, configured to include multiple selector switches coupled in parallel to the word line and to select any one of the multiple parallel-coupled selector switches in response to an externally applied selection signal; a fixed resistor block including multiple fixed resistors coupled to the bit line; a cross-point block configured such that the multiple selector switches in the multiplexer and the multiple fixed resistors in the fixed resistor block intersect in a matrix form so as to be coupled to each other and each of the selector switches in the multiplexer has a unique number of cross-points; and a conductive plate on the fixed resistor block.

20 Claims, 11 Drawing Sheets

MULTI-LEVEL SYNAPTIC WEIGHT DEVICE OF VERTICAL CROSS-POINT STRUCTURE IN THREE DIMENSION AND FABRICATION THEREOF

CROSS-REFERENCE TO RELATED APPLICATION

This application claims priority under 35 U.S.C. § 119 to Korean Patent Application No. 10-2018-0030166 filed on Mar. 15, 2018, which is incorporated herein by reference in its entirety.

BACKGROUND

1. Field

Exemplary embodiments relate to a synaptic weight device and a method for fabricating the same, and more particularly, to a multi-level synaptic weight device having a 3D vertical cross-point structure, and a method for fabricating the same.

2. Discussion of the Related Art

Artificial intelligence (AI) is receiving attention as a core technology of the Fourth Industrial Revolution, along with Internet-of-Things (IoT), big data, and the like. Machine learning, which enables a machine system to evaluate and generalize data by itself without individually coded programming, is a branch of AI, and is used in various fields, such as Internet search, news category classification, translation, image recognition, and the like.

In order to implement machine learning, not only software but also hardware for running the software is necessary. In the case of a Convolutional Neural Network (CNN) used for an image recognition system for recognizing characters, and the like, a linear weight bit-width that is equal to or greater than 16 bits is required. In order to respond to the requirements of such a system, online service using a server makes up a large part of AI services currently being provided.

In order to fabricate a multi-level synaptic weight device having a 16 or greater bit-width required by a neural network, the use of a resistive switching material having multiple resistance values may be attempted, but there are limitations and difficulties in finding such materials, in which the resistance value changes depending on 16 bit-width.

SUMMARY

Various embodiments are directed to a multi-level synaptic weight device having a three-dimensional (3D) vertical cross-point structure that is capable of changing a synaptic weight and of setting a bit-width that is sufficient to satisfy a required synaptic weight.

Also, various embodiments are directed to a method for fabricating a multi-level synaptic weight device having a 3D vertical cross-point structure that has advantages from layered structures.

In an embodiment, a multi-level synaptic weight device having a 3D vertical cross-point structure, a multi-level conductance structure including a word line and a bit line that are electrically coupled, wherein the multi-level conductance structure comprises: a control peripheral circuit including a multiplexer including a plurality of selector switches coupled in parallel to the word line; a fixed resistor block including a plurality of fixed resistors coupled to the bit line; a cross-point block including a plurality of cross-point nodes in a matrix-like structure; —and a conductive plate over the fixed resistor block, wherein the multiplexer selects any one of the plurality of selector switches in response to an externally applied selection signal, wherein the plurality of cross-point nodes are defined by areas of intersection between the plurality of selector switches in the multiplexer and the plurality of fixed resistors, and wherein each of the plurality of selector switches has a unique number of cross-point nodes.

Desirably, the control peripheral circuit is disposed over a silicon substrate, the cross-point block is disposed substantially above the peripheral circuit, and the plurality of fixed resistors are aligned to span between the cross-point block and the conductive plate.

Desirably, currents flowing in the fixed resistor block are added. Desirably, the integrator converts current flowing through the fixed resistor block into a voltage.

Desirably, a structural unit of the cross-point block includes a horizontal stack structure, a first resistive switching layer, a vertical array structure, and a second resistive switching layer, wherein a plurality of structural units of the cross-point block are repeated in a second direction, and wherein the horizontal stack structure comprises a plurality of horizontal conductive lines extending in a first direction and a plurality of horizontal insulating layers, with each of the plurality of horizontal conductive lines and each of the plurality of horizontal insulating layers alternately stacked in a sandwich-like formation extending in a third direction; the vertical array structure comprises a plurality of vertical conductive lines extending in the third direction and a plurality of vertical insulating layers, with each of the plurality of vertical conductive lines and each of the plurality of vertical insulting layers alternately stacked in a sandwich-like formation extending in the first direction; and the first resistive switching layer is interposed between the horizontal stack structure and the vertical array structure.

Desirably, each of the plurality of cross-point nodes is a conductive path depending on a weight assigned to the horizontal conductive line. Desirably, each of the plurality of cross-point nodes is a rewritable conductive path that responds to a voltage that is equal to or greater than a set value applied to the first resistive switching layer.

Desirably, the resistive switching layer comprising the plurality cross-point nodes includes a unipolar resistive switching material.

Desirably, the resistive switching layer comprising the plurality of cross-point nodes includes $NiO_x$.

Desirably, a structural unit of the cross-point block includes a horizontal stack structure, a first resistive switching layer, a vertical array structure, and a second resistive switching layer, wherein a plurality of structural units of the cross-point block are repeated in a second direction, and wherein the horizontal stack structure comprises a plurality of horizontal conductive lines extending in a first direction and a plurality of horizontal insulating layers, with each of the plurality of horizontal conductive lines and each of the plurality of horizontal insulating layers are alternately stacked in a third direction; the vertical array structure comprises a plurality of vertical conductive lines extending in the third direction and a plurality of vertical insulating layers, with each of the plurality of vertical conductive lines and each of the plurality of vertical insulting layers alternately stacked in the first direction, the first resistive switching layer is interposed between the horizontal stack structure and the vertical array structure, and wherein each of the plurality of cross-point nodes is a permanent conductive path generated by dielectric breakdown by an applied voltage depending on a weight assigned to the horizontal conductive line.

Desirably, the resistive switching layer including the plurality of the cross-point nodes comprises $SiO_2$.

Desirably, each of the plurality of horizontal conductive lines includes a p-n junction through which a forward current flows in a direction from the horizontal conductive line to the vertical conductive line.

Desirably, when the horizontal stack structure includes N horizontal conductive lines and when the vertical array structure includes P vertical conductive lines, the number of cross-point nodes that have a conductive path and that are common to an m-th horizontal conductive line on an m-th layer (where $1 \leq m \leq N$) is equal to or less than P.

Desirably, when an input pulse is applied to one of the plurality of horizontal conductive lines, currents flow in the fixed resistors coupled to the vertical conductive lines that are electrically coupled to the one of the plurality of horizontal conductive lines through cross-point nodes having conductive paths, and wherein the currents flowing in the fixed resistors are added in the conductive plate and form an output signal.

Also, in an embodiment, a method for fabricating a multi-level synaptic weight device having a three-dimensional (3D) vertical cross-point structure, comprising: forming an insulating layer and a conductive layer over the insulating layer, the conductive layer partitioned into a first conductive region and a second conductive region, each of which have substantially the same width and substantially the same linear shape, that are alternately placed in a fixed direction; forming a stack structure having N insulating layers and N conductive layers by repeating the forming the insulating layer and the conductive layer N times; etching the stack structure to form multiple horizontal insulating layers and multiple horizontal conductive lines, each of the multiple horizontal conductive lines having a linear p-n junction formed by the first conductive region and the second conductive region; forming resistive switching layers on opposite sidewalls of a gap formed by etching the stack structure; filling a gap between the resistive switching layers with a vertical conductive layer; forming multiple vertical conductive lines by etching portions of the vertical conductive layer; forming multiple vertical insulating layers between the vertical conductive lines; forming an upper insulating layer over the multiple vertical conductive lines and the vertical insulating layer; and forming gaps that expose the multiple vertical conductive lines by vertically etching the upper insulating layer in regions common to the vertical conductive lines, and forming fixed resistors in the gaps formed in the upper insulating layer. Desirably, the first conductive region comprises an n-type polysilicon material, and the second conductive region comprises a p+-type polysilicon material.

Desirably, the fixed resistor is a resistor device having a predetermined resistance value.

Desirably, the forming of the insulating layer and the conductive layer further comprises: stacking a polysilicon layer over the insulating layer; and partitioning the polysilicon layer into substantially linear regions having substantially the same width, and implanting ions in the linear regions, to form alternating n-type polysilicon regions and p+-type polysilicon regions.

Desirably, the forming of the multiple horizontal conductive lines and the multiple horizontal insulating layers further comprises: performing etching to remove a portion of one of the n-type polysilicon regions or one of the p+-type polysilicon regions. Desirably, the resistive switching layer includes $SiO_2$, $NiO_x$, or a phase change material.

DETAILED DESCRIPTION

The advantages and features of the present disclosure and methods of achieving them will be apparent from the following exemplary embodiments to be described in more detail with reference to the accompanying drawings. However, it should be noted that the present disclosure is not limited to the following exemplary embodiments, and may be implemented in various forms. Accordingly, the exemplary embodiments are provided only to disclose the present invention and let those skilled in the art know the category of the present invention, and the present invention is to be defined based only on the claims, however, the disclosure is not limited thereto.

The terms used herein are for the purpose of describing particular embodiments only and are not intended to limit the present disclosure or invention. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element, or intervening elements may be present. In contrast, when an element is referred to as being "directly connected to" or "directly coupled to" another element, there are no intervening elements present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features.

Embodiments are described herein with reference to cross-sectional views and/or top plan views that are schematic illustrations of idealized embodiments. In the drawings, the thickness and relative thickness of layers and regions may be exaggerated for effective description of technical content. Accordingly, the shapes of the illustrations may vary as a result of manufacturing techniques and/or tolerances. Thus, embodiments should not be construed as limited to the particular shapes of regions illustrated herein but are to include deviations in shapes that result from manufacturing methods or requirements. For example, an etched region illustrated as a rectangle can have rounded or curved features. Thus, the regions illustrated in the drawings are schematic in nature, and their shapes are not intended to illustrate the specified shape of a region of a device and are not intended to limit the scope of the present disclosure.

Like numbers refer to like elements throughout the specification. Thus, the same or similar numbers may be described with reference to other drawings even if they are neither mentioned nor described in the corresponding drawing. Also, elements that are not denoted by reference numbers may be described with reference to other drawings.

Figure 1:
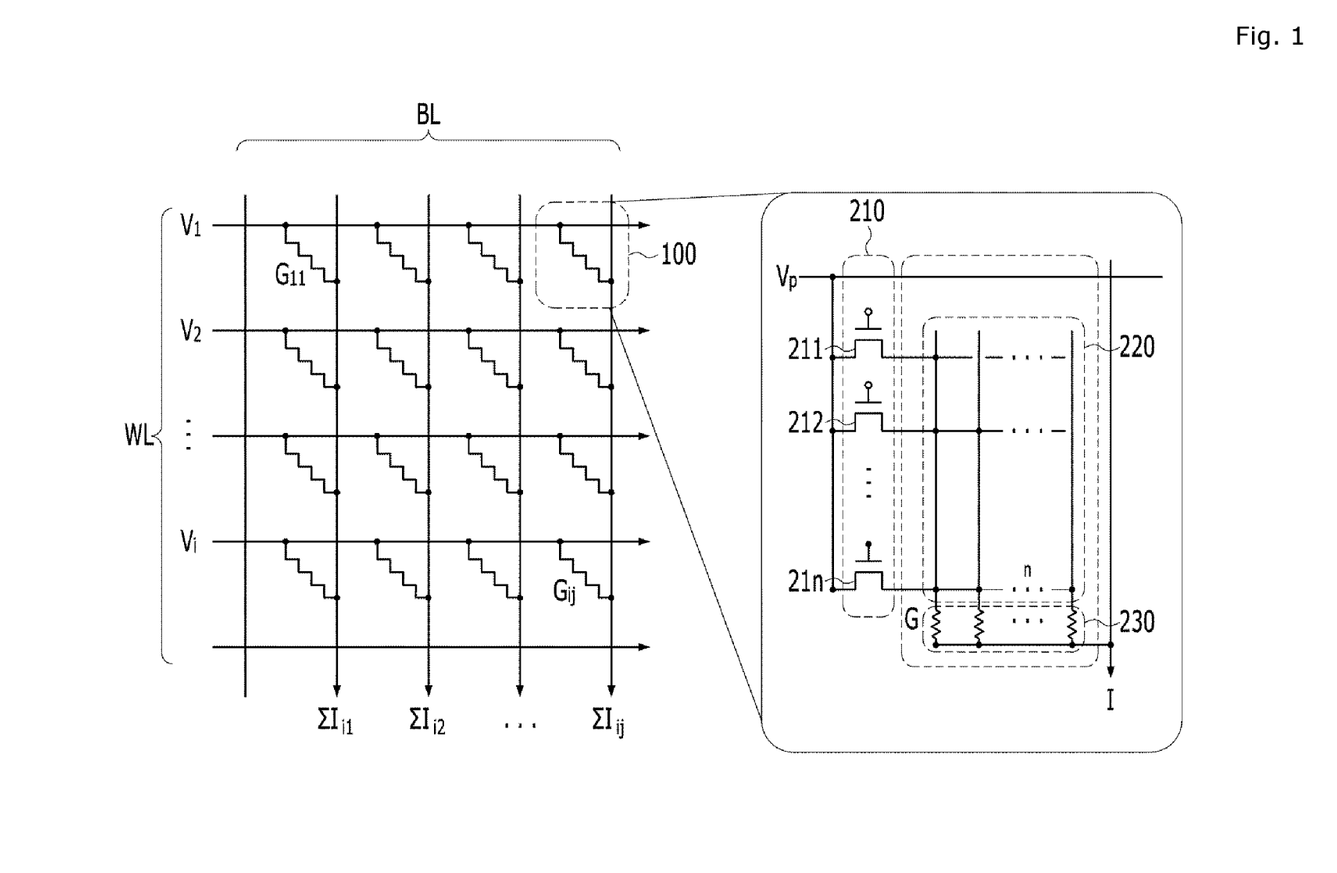
FIG. 1 is a concept diagram of a multi-level synaptic weight device having a 3D vertical cross-point structure according to an embodiment.

FIG. 1 is a concept diagram of a multi-level synaptic weight device having a 3D vertical cross-point structure according to an embodiment.

A multi-level synaptic weight device having a 3D vertical cross-point structure according to an embodiment includes a multi-level conductance structure 100 that couples any one of multiple or a plurality word lines WL to any one of multiple or a plurality bit lines BL. Referring to the enlarged view on the right side of FIG. 1, the multi-level conductance structure 100 may include a control peripheral circuit 210, including a multiplexer which includes multiple or a plurality of selector switches that are coupled in parallel to a word line, arranged to select any one of the multiple or a plurality of parallel-coupled selector switches in response to an externally applied selection signal, a fixed resistor block 230 including multiple or a plurality of fixed resistors coupled in parallel to a bit line; and a cross-point block 220 configured or designed such that the multiple selector switches in the multiplexer and the multiple fixed resistors in the fixed resistor block 230 intersect in a matrix or matrix-like manner so as to be electrically coupled to each other at cross-point nodes, but each of the selector switches in the multiplexer has a unique number of cross-point nodes.

Each of the selector switches in the multiplexer may be implemented as a ferroelectric gate transistor. The ferroelectric gate transistor may have a Metal/Ferroelectric/Semiconductor (MFS) structure in which a semiconductor, a ferroelectric layer or film, and a metal are sequentially stacked or layered. According to one operating method of a ferroelectric gate transistor, a write voltage is applied between the source electrode and the gate electrode of the ferroelectric gate transistor by opening the drain electrode thereof, whereby data may be written in the ferroelectric film. Also, according to another operating method of the ferroelectric gate transistor, an erase voltage is applied between the source electrode and the gate electrode of the ferroelectric gate transistor by opening the drain electrode thereof, whereby data in the ferroelectric film may be erased. And, according to an operating method of the ferroelectric gate transistor, a read voltage is applied between the drain electrode and the source electrode of the ferroelectric gate transistor by grounding the gate electrode, whereby data in the ferroelectric film may be read. Thus, as described above, a ferroelectric gate transistor may write, erase or read data using three terminals.

A multi-level synaptic weight device having a 3D vertical cross-point structure configured or structured as described above operates as follows.

When a first selector switch 211 in the multiplexer is turned on in response to an externally applied first switching control signal, because only one cross-point is coupled to the first selector switch 211, a current (I=GV) may flow through a single fixed resistor G in the fixed resistor block 230.

When a second selector switch 212 in the multiplexer is turned on in response to an externally applied second switching control signal, because only two cross-points are coupled to the second selector switch 212, a current (I=2GV) may flow through two fixed resistors (G+G) in the fixed resistor block 230.

As described above, depending on which selector switch is turned on in the multiplexer, the number of cross-point nodes varies. Also, depending on the selected cross-points nodes, the number of fixed resistors coupled thereto is determined. Therefore the magnitude of the output current changes based on which selector switch is activated.

Figure 2:
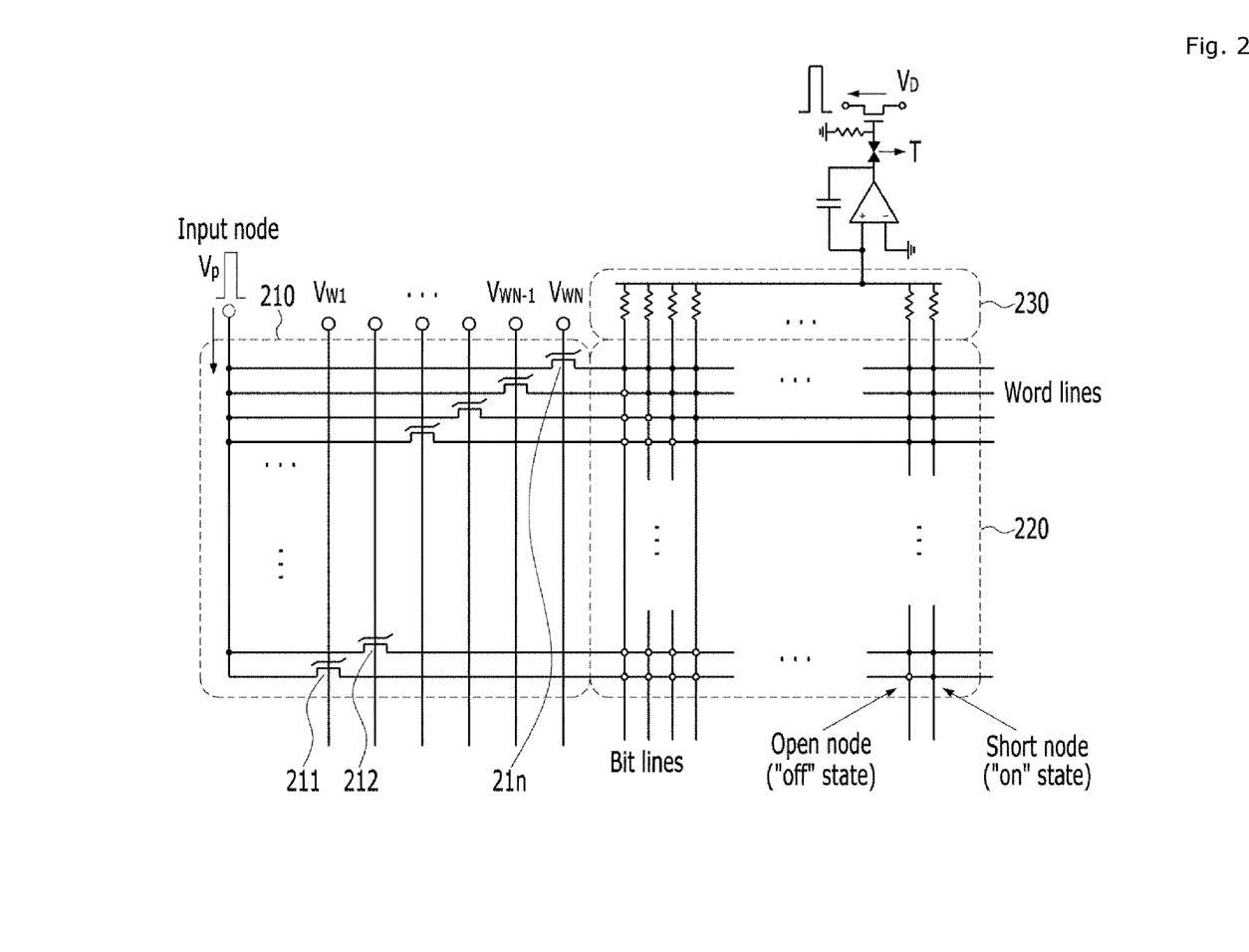
FIG. 2 is a concept diagram for implementing the multi-level conductance structure shown in FIG. 1 in a 3D structure.

FIG. 2 is a concept diagram for implementing the multi-level conductance structure 100 shown in FIG. 1 in a 3D structure.

The control peripheral circuit 210 including the multiplexer according to an embodiment of the present disclosure may be disposed on a silicon substrate on the bottom surface of a 3D hexahedral structure.

According to an embodiment, the cross-point block 220 may be disposed in a matrix or matrix-like structure in a vertical or substantially vertical plane above the peripheral circuit 210 in the 3D hexahedral structure. Here, a cross-point marked as a white circle indicates an open node that is turned off, but a cross-point marked as a black circle indicates a short node that is turned on. According to another embodiment, the cross-point block 220 may be arranged in a matrix or matrix-like arrangement a vertical or substantially vertical plane on a side of the peripheral circuit 210.

The respective fixed resistors in the fixed resistor block 230 may be disposed in parallel or substantially parallel to and directly above the cross-point block 220.

Figure 3:
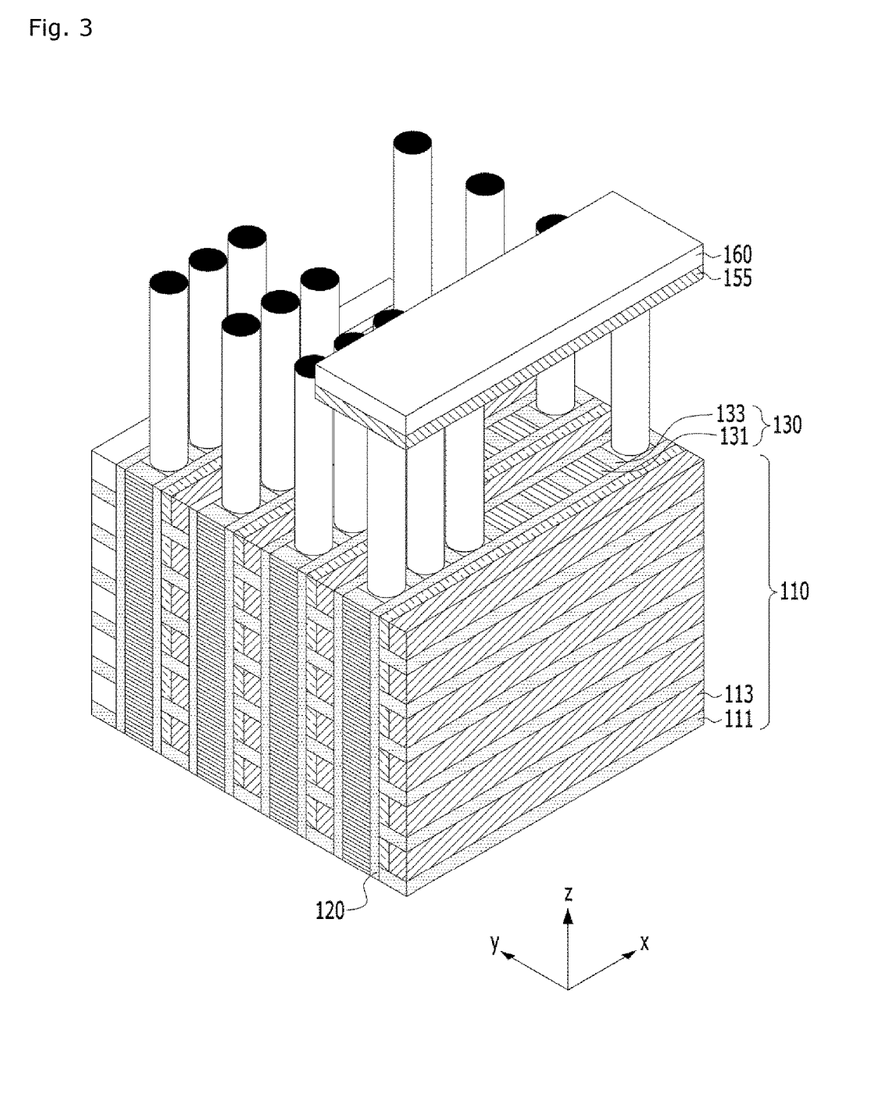
FIG. 3 is a perspective view that schematically illustrates the structure of a multi-level synaptic weight device having a 3D vertical cross-point structure according to an embodiment.
Figure 4:
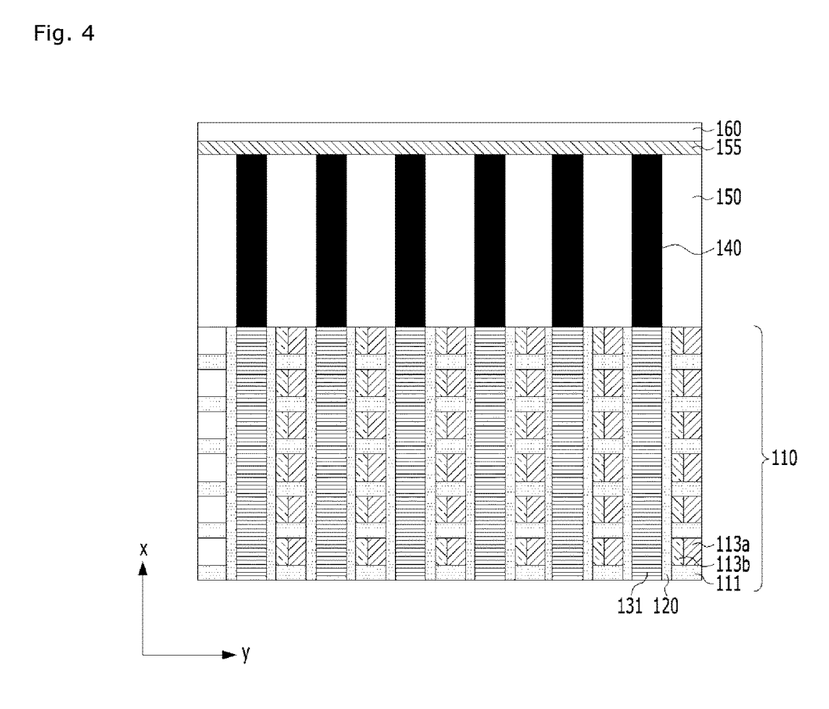
FIG. 4 is a cross-sectional view that illustrates the structure of a multi-level synaptic weight device having a 3D vertical cross-point structure according to an embodiment.

FIG. 3 is a perspective view that schematically illustrates the structure of a multi-level synaptic weight device having a 3D vertical cross-point structure according to an embodiment, and FIG. 4 is a cross-sectional view that illustrates the structure of a multi-level synaptic weight device having a 3D vertical cross-point structure according to an embodiment. Although embodiments of the present disclosure are described in relation to an orthogonal x-y-z axis system for convenience and ease of explanation, other directional or axes systems may be used.

Referring to FIG. 3 and FIG. 4, in a multi-level synaptic weight device having a 3D vertical cross-point structure according to an embodiment, a cross-point block 220 may include multiple or a plurality of horizontal stack structures 110, multiple or a plurality of vertical array structures 130, and resistive switching layers 120, each of which is interposed between faces or surfaces to which the horizontal stack structure 110 and the vertical array structure 130 would be adjacent or juxtaposed. An horizontal stack structure 110 may include multiple or a plurality of horizontal conductive lines 113 extended in the x-direction and horizontal insulating layers 111 interposed between the horizontal conductive lines 113. A vertical array structure 130, interposed between the horizontal stack structures 110, may include multiple or a plurality of vertical conductive lines 131 extended in the z-direction and vertical insulating layers 133 interposed between the vertical conductive lines 131.

Referring again to FIG. 3 and FIG. 4, the cross-point block 220 may have a structure that is constructed in such a way that the horizontal stack structures 110, the vertical array structures 130, and resistive switching layers 120, each of which is interposed between the horizontal stack structure 110 and the vertical array structure 130, are alternately and repeatedly aligned or positioned extending in the y-direction.

The horizontal stack structure 110 may include a horizontal insulating layer 111, extending in the x-direction, which is and parallel or substantially parallel to a substrate (not illustrated) that is in or substantially in an x-y plane. The horizontal stack structure 110 may also include a horizontal conductive line 113 disposed on the horizontal insulating layer 111, and the horizontal insulating layer 111 and the horizontal conductive line 113 together make a unit of the horizontal stack structure. Horizontal insulating layers 111 and horizontal conductive lines 113 are alternately stacked or layered in the z-direction, which is perpendicular or substantially perpendicular to the substrate, such that a plurality of units positioned in a sandwich-like manner may be included in a horizontal stack structure 110.

The horizontal insulating layers 111 insulate the multiple horizontal conductive lines 113 from each other. A horizontal insulating layer 111 may use a known insulating material. For example, the material for the horizontal insulating layer may be silicon dioxide ($SiO_2$), silicon nitride ($Si_3N_4$), metallic oxide, metallic nitride, or polymers, but the material is not limited thereto.

The horizontal conductive line 113 may comprise polysilicon. The horizontal conductive line 113 may have high dopant concentrations in order to function as an electric conductor. When the horizontal conductive line 113 includes a p-type polysilicon line 113a doped with p-type dopant, an n-type polysilicon line 113b may be disposed between the horizontal conductive line 113 and the resistive switching layer 120. The p-type polysilicon line 113a may include a p+ type doped material. The interface of p-type polysilicon line 113a and the n-type polysilicon line 113b may form a p-n junction. The p-n junction prevents or limits current from flowing from the vertical conductive line 131 through the horizontal conductive line 113, thereby minimizing the sneak current flowing through the conductive path of an unselected cross-point node.

The vertical array structure 130 may include a vertical conductive line 131, extended in the z-direction, which is perpendicular or substantially perpendicular to the horizontal conductive line 113. The vertical array structure 130 may include a plurality of vertical conductive lines 131 that are aligned with and extend in the x-direction. In order to insulate the plurality of vertical conductive lines 131 from each other, vertical insulating layers 133 may be disposed between vertical conductive lines 131. A vertical conductive line 131 and a vertical insulating layer 133 together make a unit of a vertical array structure. A vertical array structure 130 may include a plurality of vertical conductive lines 131 and a plurality of vertical insulating layers 133 that are alternately aligned or layered along an x-direction and parallel or substantially parallel to the horizontal stack structure 110, such that a plurality of units positioned in a sandwich-like manner may be included in a vertical array structure 130. Vertical conductive lines 131 may use a known conductive material. For example, a vertical conductive line 131 may comprise polysilicon, but the material layer is not limited thereto.

Depending on the number of stacked layers or units in the vertical array structure 130, the number of available weights is determined. That is, as many conductive paths as the number of layers in the vertical array may be created in each horizontal conductive line 113. For example, when the vertical array structure 130 comprises 1000 units of a vertical array structure, a weight ranging from 1 to 1000 may be assigned to each horizontal conductive line 113 of the horizontal stack structure 110.

The resistive switching layer 120 may be disposed in a plane-like shape between the horizontal stack structure 110 and the vertical array structure 130. The resistive switching layer 120 may comprise a material that enables a permanent conductive path to be formed by dielectric breakdown occurring when a voltage exceeding a certain or threshold voltage value is applied thereto. In another example, resistive switching layer 120 may comprise a material that enables a rewritable conductive path to be formed by the change of resistance when the voltage exceeding the certain or threshold voltage value is applied thereto. As an example of the material that enables a permanent conductive path to be formed, $SiO_2$, the thickness of which enables dielectric breakdown to occur in the range of a write voltage, may be used for in resistive switching layer 120. As an example of the material that enables a rewritable conductive path to be formed, metallic oxide that is a unipolar resistive switching material, chalcogenide, perovskite, a phase change material, or $NiO_x$ (Nickel Oxide) may be used for in resistive switching layer 120.

The resistive switching layer 120 may include cross-point nodes at which N horizontal conductive lines 113 and P vertical conductive lines 131 would otherwise physically intersect along a y-direction.

As described above, the horizontal conductive lines 113 may form a conductive path at each of the cross-point nodes depending on its weight. For example, the vertical array structure 130 according to an embodiment may include P layers of vertical conductive lines 131. The number of cross-point nodes have a conductive path and that are common to an m-th horizontal conductive line 113 on an m-th layer (where $1 \leq m \leq N$) is equal to or less than P. Accordingly, a weight ranging from 1 to N may be assigned to each of the horizontal conductive lines 113. For example, when the vertical conductive line 131 arranged as the m-th layer is referred to as the m-th vertical conductive line, 1 to N conductive path(s) may be formed at the N cross-point nodes formed by any horizontal conductive line 113. Here, when the weight is set to N, it is possible to make current flow in the N vertical conductive lines 131 coupled to a given horizontal conductive line by applying voltage between an arbitrary horizontal conductive line and the N vertical conductive lines 131.

Also, the fixed resistor block 230 may include multiple or a plurality of fixed resistors 140, each electrically coupled to a corresponding vertical conductive line 131, an upper insulating layer 150 that insulates the fixed resistors 140 from each other, an electrode surface 155 on the upper surfaces of the multiple or a plurality of fixed resistors 140, and a conductive plate 160 disposed above the electrode surface 155.

The upper insulating layer 150 may be used to insulate the fixed resistors 140 from each other and to support the structure of the fixed resistors 140. The upper insulating layer 150 may comprise a known insulating material, such as $SiO_2$ or the like.

The conductive plate 160 may support the fixed resistors 140, and may output additive currents flowing in through fixed resistors 140.

An input signal by on-chip learning may have a multi-level value based on the number of voltage pulses inputted during a time period and/or depending on the amplitude of the voltage pulse. The multi-level value may be an input to the multi-level synaptic weight device having a 3D vertical cross-point structure. Here, a predetermined or known number of voltage pulses that are inputted during a certain time period or an inputted voltage signal having a predetermined or known amplitude may be applied to a horizontal conductive layer 113 in which a selector transistor or switch (not illustrated) has the corresponding weight in the multi-level synaptic weight device having a 3D vertical cross-point structure.

Through conductive paths formed at the cross-point nodes in resistive switching layer 120 coupled to the horizontal conductive layer 113, the current caused by the inputted voltage signal flows into the vertical conductive layers 131, and then the current flows through the fixed resistors 140 coupled to the vertical conductive layers 131. The currents flowing in the respective fixed resistors 140 are added in conductive plate 160 and sent to an integrator, and the integrator may convert the inputted current into a voltage. The output signal, converted into the voltage, may be delivered to an input node h included in a next input layer when the amplitude of the voltage is equal to or greater than a threshold voltage. The input layer, hidden layer h, and output layer may be included in a neural network that may be configured with horizontal lines and vertical lines comprising the synaptic weight device.

Figure 5:
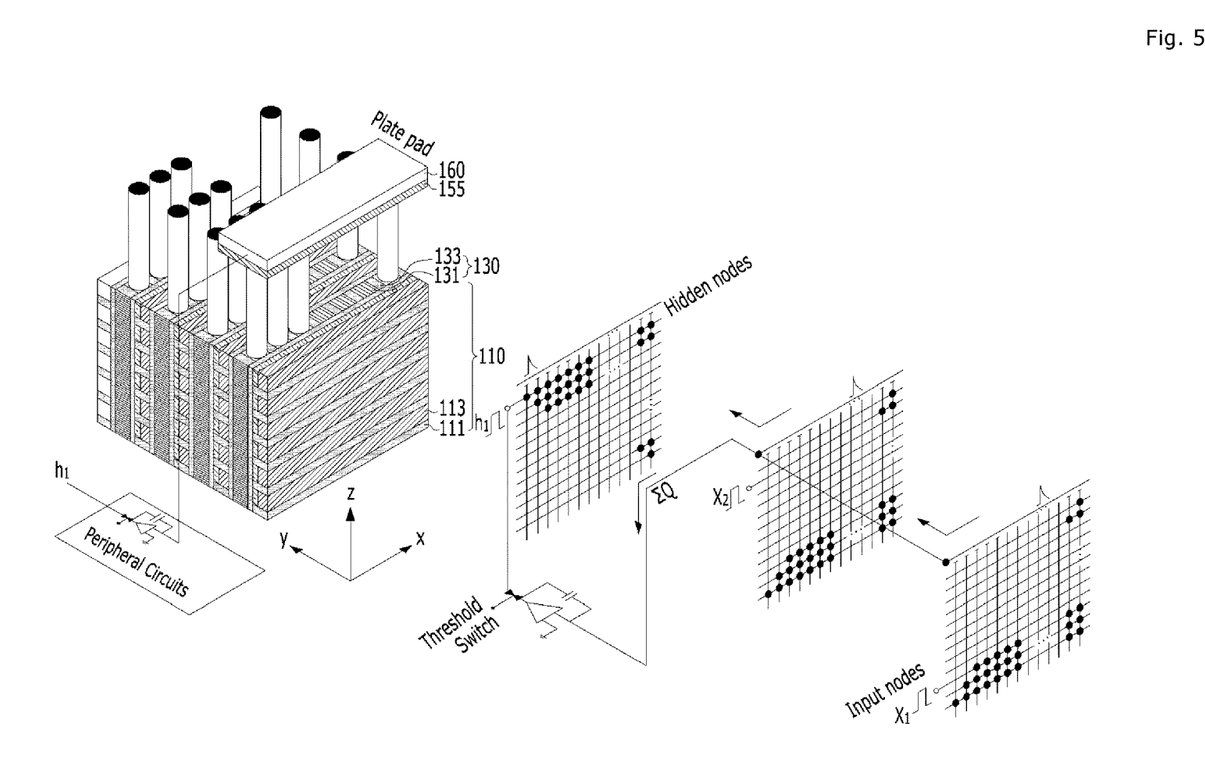
FIG. 5 is a cross-sectional view and a conceptual circuit diagram that show an operating method of a multi-level synaptic weight device having a 3D vertical cross-point structure according to an embodiment.

FIG. 5 is a perspective view and a conceptual circuit diagram that show an operating method of a multi-level synaptic weight device having a 3D vertical cross-point structure according to an embodiment.

Referring to FIG. 5, the bit-width of a weight may be determined depending on the number of units in the horizontal stack structure 110 of the cross-point structure. The resistive switching layer 120 interposed between a pair of the horizontal stack structure 110 (i.e., an unit consisting of a horizontal conductive line 113 and a horizontal insulation layer 111) and the vertical array structure 130 of the cross-point structure may constitute a weight plane. The weight plane corresponds to a synapse of a neural network layer, and the horizontal conductive layer and the vertical conductive layer forming the weight plane may be an input layer or an output layer, relative to other horizontal conductive layers and vertical conductive layers in the neural network layer.

The current generated by the operation of a first neural network input layer may be converted into a voltage pulse and be delivered to a next hidden layer, and may be finally outputted to an output layer by repeating such a process. In this process, the bit-width of the final weight, the number of layers of a neural network, and the number of nodes of the neural network are determined by optimizing the weight level, the number of layers in the neural network, and the number of nodes in the neural network, and the determined information may be stored in a storage device.

Hereinafter, a method for fabricating a multi-level synaptic weight device having a 3D vertical cross-point structure will be described.

FIGS. 6 to 14 are views in which a method for fabricating a multi-level synaptic weight device having a 3D vertical cross-point structure according to an embodiment is schematically illustrated in an x-y plane and an y-z plane.

Figure 6:
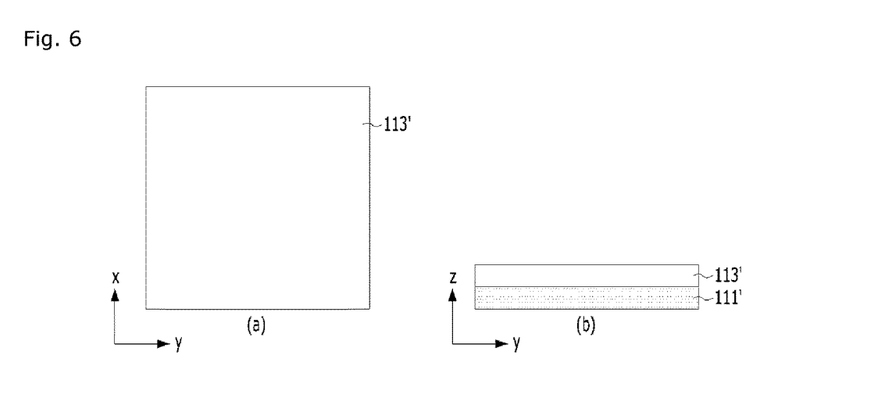
FIGS. 6 to 14 are views that schematically illustrate a method for fabricating a multi-level synaptic weight device having a 3D vertical cross-point structure according to an embodiment on an x-y plane and a y-z plane.

Referring to FIG. 6, first, an insulating layer 111' is formed so as to be parallel to, or formed on, a substrate. A polysilicon layer 113' may be formed or disposed on the insulating layer 111'. The insulating layer 111' may have a sufficient thickness such that dielectric breakdown is prevented from occurring within the operating voltage range.

Figure 7:
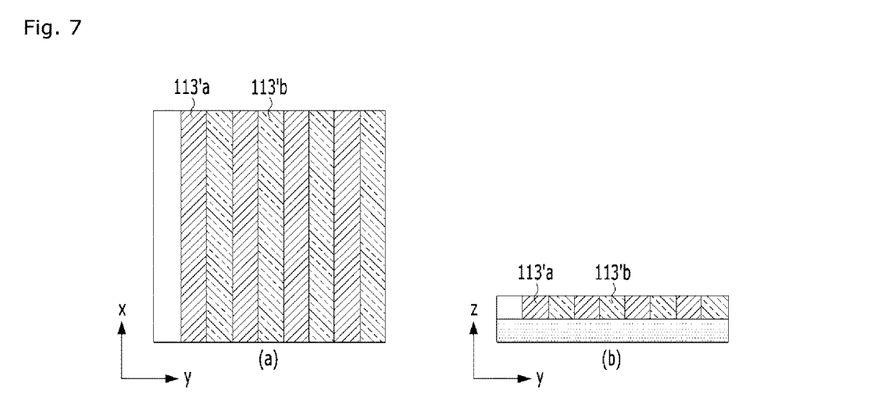

Referring to FIG. 7, the polysilicon layer 113' is partitioned into linear regions having the same or approximately the same width, and an n-type dopant and a p-type dopant are alternately implanted in the partitioned regions, whereby a p+ type polysilicon layer 113'a and an n-type polysilicon layer 113b' may be generated. Here, a dopant, such as boron (B), aluminum (Al), gallium (Ga) or indium (In), may be applied as the p-type dopant, and a dopant, such as phosphorus (P), arsenic (AS) or antimony (Sb), may be applied as the n-type dopant.

Figure 8:
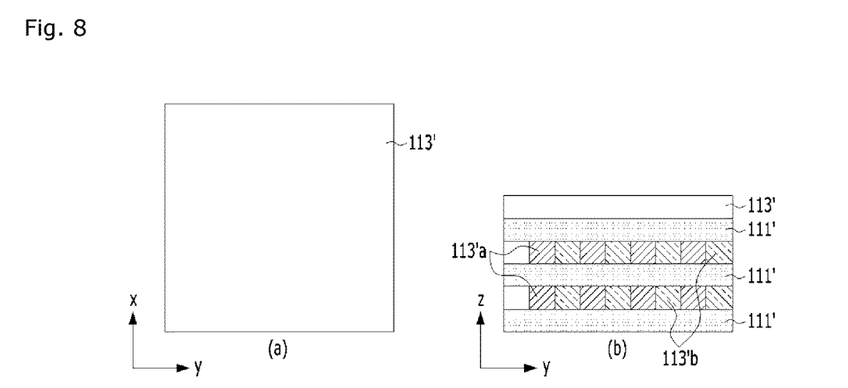

Referring to FIG. 8, an insulating layer 111' may be deposited or layered on the polysilicon layer 113' in which the region of p+-type polysilicon layer 113'a and the region of the n-type polysilicon layer 113'b are alternately aligned or structured. Then, another polysilicon layer 113' is disposed on the newly deposited insulating layer 111'. This polysilicon layer 113' is partitioned into linear regions having the same or approximately the same width, and a p-type dopant and an n-type dopant are alternately implanted in the partitioned regions, whereby the region of a p+ type polysilicon layer 113'a and the region of an n-type polysilicon layer 113'b may be alternately formed. By repeating the above-described process, a stack-like structure having n insulating layers 111' and n polysilicon layers 113' may be produced.

Figure 9:
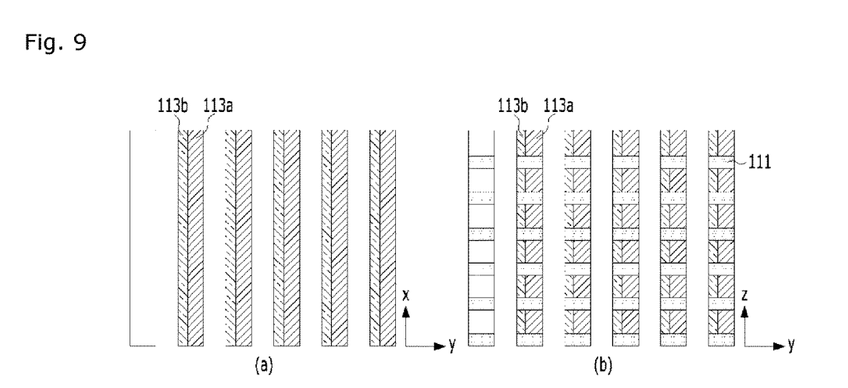

Referring to FIG. 9, portions of the p+-type polysilicon layer 113'a and/or the n-type polysilicon layer 113'b are etched, such that a p-n junction may be formed between horizontal conductive line 113 in which a p+-type polysilicon conductive line 113a and an n-type polysilicon conductive line 113b may be formed. In order to sufficiently decrease the resistance of the p-n junction, the width of the remaining n-type polysilicon conductive line 113b may be smaller or less than the width of the p+-type polysilicon conductive line 113a. The horizontal conductive lines 113 are insulated from each other by the horizontal insulating layers 111. Also, the horizontal conductive lines 113 and the horizontal insulating layers 111 arranged above and below, or adjacent to, each other to make units in a horizontal stack structure 110.

Figure 10:
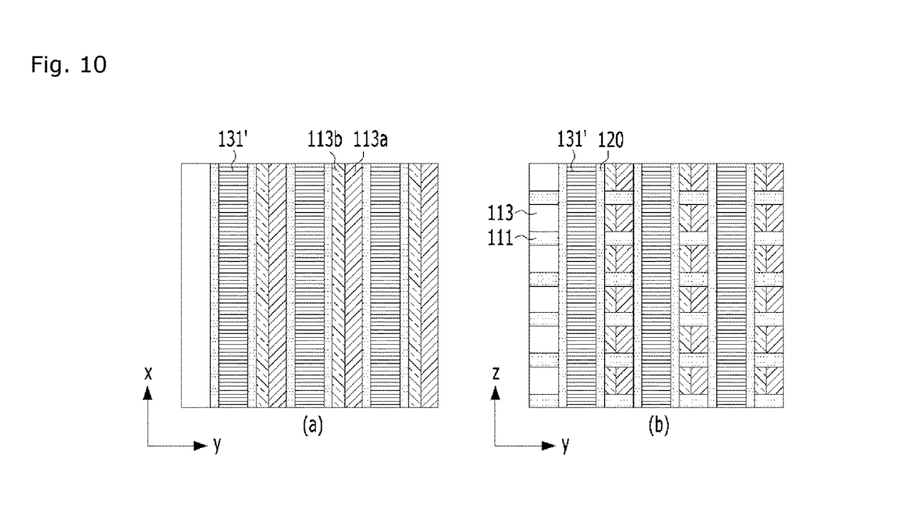

Referring to FIG. 10, resistive switching layers 120 may be disposed or formed on the opposite sidewalls of a gap between the horizontal stack structures 110. A gap between the resistive switching layers 120 may be filled with a vertical conductive layer 131'.

Figure 11:
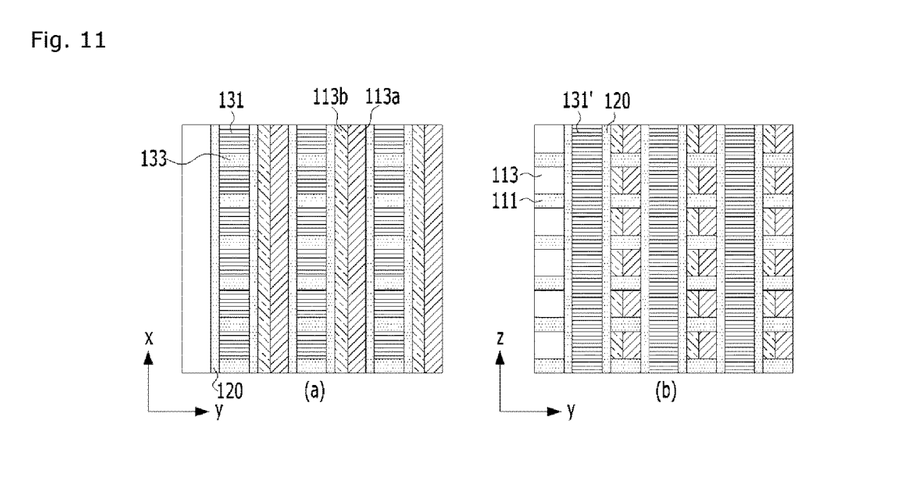

Referring to FIG. 11, the vertical conductive layer 131' is partitioned into regions having the same or substantially the same width. Portions of the vertical conductive line 131 excluding the partitioned regions are etched to create gaps. Etched gaps are filled with an insulating material, forming vertical insulating layers 133. The vertical conductive line 131 and the vertical insulating layer 133 alternate within the gap between resistive switching layers 120, and the layers form a vertical array structure 130. Also, horizontal stack structures 110 and vertical array structures 130 are alternately and repeatedly aligned together with resistive switching layers 120, whereby a cross-point structure may be formed.

Figure 12:
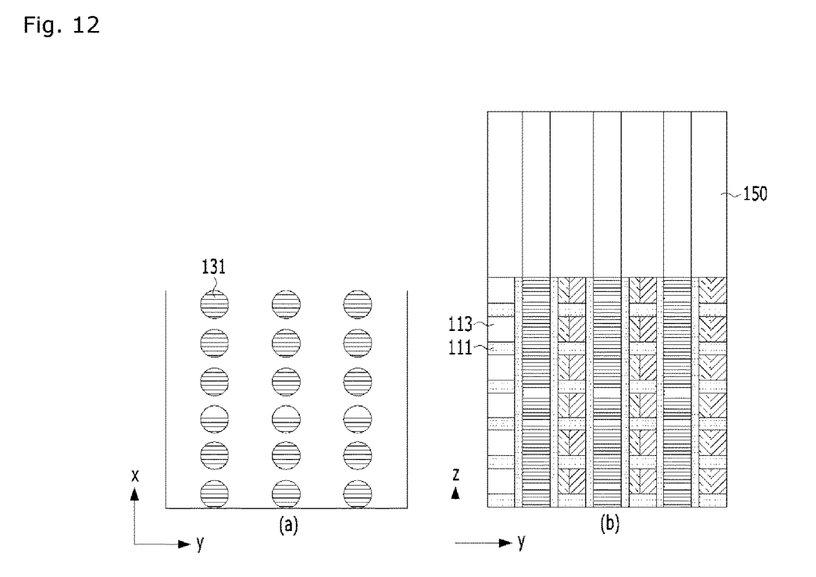

Referring to FIG. 12, an upper insulating layer 150 is formed or disposed on the cross-point structure. The vertical conductive lines 131 may then be exposed by vertically etching portions of the upper insulating layer 150, above the vertical conductive lines 131.

Figure 13:
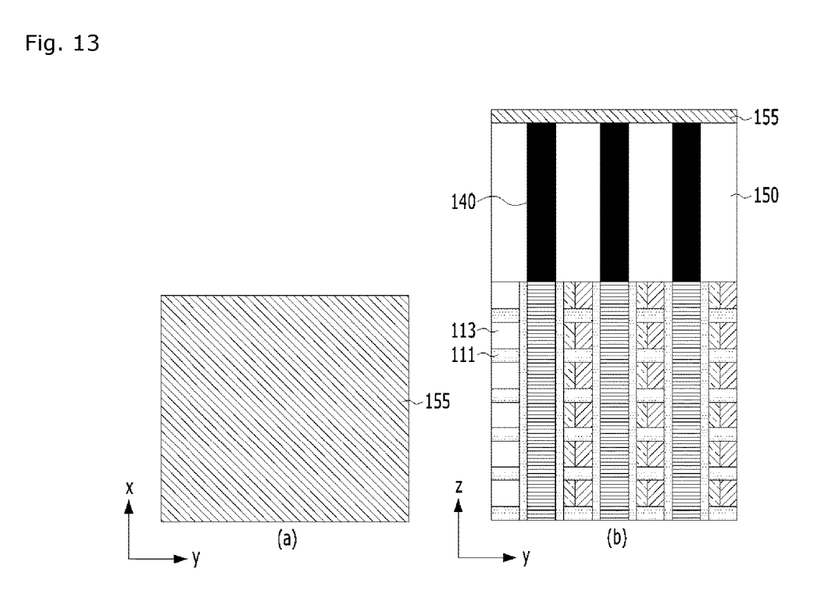

Referring to FIG. 13, the gaps resulting from etching the upper insulating layer 150 are filled with a conductive material having a predetermined or known resistance value, creating fixed resistors 140.

Then, the upper surface of the fixed resistors 140 and the upper insulating layer 150 are etched.

And then, a conductive material is deposited on the upper surface of the fixed resistors 140 and the upper insulating layer 150, thereby creating an upper electrode 155.

Figure 14:
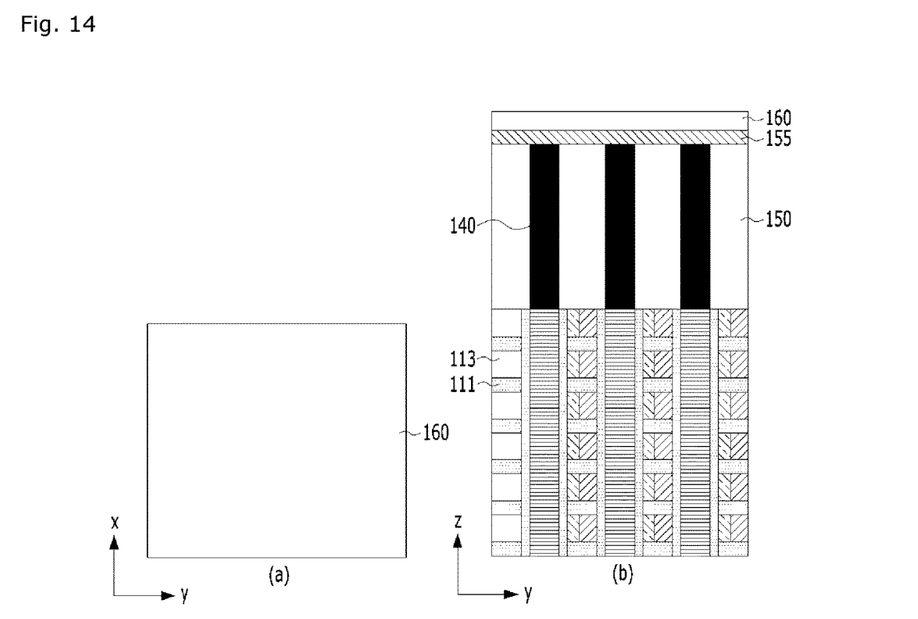

Referring to FIG. 14, a conductive plate 160 may be formed or disposed on the upper electrode 155. The conductive plate 160 may add together the currents flowing in the fixed resistors 140 and convert the added currents into an output signal.

The multi-level synaptic weight device having a 3D vertical cross-point structure according to embodiments of the present invention may include a passive element structure that is electrically coupled to vertical conductive lines in the vertical cross-point structure in which the vertical conductive lines and horizontal conductive lines are alternately arranged.

In embodiments of the present invention, a voltage pulse is applied as an input signal, currents flowing in resistors are collected and converted into voltage, and the voltage is used as an output signal. Accordingly, multiple passive elements determined depending on the number of conductive paths of the cross-point nodes are used, whereby the output signal resulting from the input signal may have a linear value.

According to embodiments of the present invention, an input voltage is applied to a group of passive elements by selecting a horizontal conductive line electrically coupled to previously formed conductive paths. This structure may overcome the restriction of a 1:1 Transistor to Weight (1T-1W) structure in which a selector transistor is required for each weight element. Also, because a learned weight value is not rewritten to the element, but instead a group of weights for which conductive paths are already formed is selected, learning speeds increase.

The linear multi-level weight value may be adjusted by selecting a horizontal conductive line based on the required multi-level weight value. Also, a circuit for selecting a conductive path may be disposed below the element, and the element also has a multi-level stack-like structure, whereby space may be efficiently used.

Although various embodiments have been described for illustrative purposes, it will be apparent to those skilled in the art that various changes and modifications may be made without departing from the spirit and scope of the invention as defined in the following claims.

What is claimed is:

1. A multi-level synaptic weight device having a three-dimensional (3D) vertical cross-point structure, comprising:
a multi-level conductance structure including a word line and a bit line that are electrically coupled,
wherein the multi-level conductance structure comprises:
a control peripheral circuit including a multiplexer including a plurality of selector switches coupled in parallel to the word line;
a fixed resistor block including a plurality of fixed resistors coupled to the bit line;
a cross-point block including a plurality of cross-point nodes in a matrix-like structure; and
a conductive plate over the fixed resistor block,
wherein the multiplexer selects any one of the plurality of selector switches in response to an externally applied selection signal,
wherein the plurality of cross-point nodes are defined by areas of intersection between the plurality of selector switches in the multiplexer and the plurality of fixed resistors, and
wherein each of the plurality of selector switches has a unique number of cross-point nodes.

2. The multi-level synaptic weight device of claim 1, wherein the control peripheral circuit is disposed over a silicon substrate, the cross-point block is disposed substantially above the peripheral circuit, and the plurality of fixed resistors are aligned to span between the cross-point block and the conductive plate.

3. The multi-level synaptic weight device of claim 2, wherein currents flowing in the fixed resistor block are added.

4. The multi-level synaptic weight device of claim 3, further comprising an integrator, wherein the integrator converts current flowing through the fixed resistor block into a voltage.

5. The multi-level synaptic weight device of claim 3, wherein a structural unit of the cross-point block includes a horizontal stack structure, a first resistive switching layer, a vertical array structure, and a second resistive switching layer,
wherein a plurality of structural units of the cross-point block are repeated in a second direction, and
wherein
the horizontal stack structure comprises a plurality of horizontal conductive lines extending in a first direction and a plurality of horizontal insulating layers, with each of the plurality of horizontal conductive lines and each of the plurality of horizontal insulating layers alternately stacked in a sandwich-like formation extending in a third direction;
the vertical array structure comprises a plurality of vertical conductive lines extending in the third direction and a plurality of vertical insulating layers, with each of the plurality of vertical conductive lines and each of the plurality of vertical insulting layers alternately stacked in a sandwich-like formation extending in the first direction; and
the first resistive switching layer is interposed between the horizontal stack structure and the vertical array structure.

6. The multi-level synaptic weight device of claim 5, wherein each of the plurality of cross-point nodes is a conductive path depending on a weight assigned to the horizontal conductive line.

7. The multi-level synaptic weight device of claim 6, wherein each of the plurality of cross-point nodes is a rewritable conductive path that responds to a voltage that is equal to or greater than a set value applied to the first resistive switching layer.

8. The multi-level synaptic weight device of claim 6, wherein the resistive switching layer comprising the plurality cross-point nodes includes a unipolar resistive switching material.

9. The multi-level synaptic weight device of claim 6, wherein the resistive switching layer comprising the plurality of cross-point nodes includes $NiO_x$.

10. The multi-level synaptic weight device of claim 2,
wherein a structural unit of the cross-point block includes a horizontal stack structure, a first resistive switching layer, a vertical array structure, and a second resistive switching layer,
wherein a plurality of structural units of the cross-point block are repeated in a second direction, and
wherein
the horizontal stack structure comprises a plurality of horizontal conductive lines extending in a first direction and a plurality of horizontal insulating layers, with each of the plurality of horizontal conductive lines and each of the plurality of horizontal insulating layers are alternately stacked in a third direction;
the vertical array structure comprises a plurality of vertical conductive lines extending in the third direction and a plurality of vertical insulating layers, with each of the plurality of vertical conductive lines and each of the plurality of vertical insulting layers alternately stacked in the first direction,
the first resistive switching layer is interposed between the horizontal stack structure and the vertical array structure, and
wherein each of the plurality of cross-point nodes is a permanent conductive path generated by dielectric breakdown by an applied voltage depending on a weight assigned to the horizontal conductive line.

11. The multi-level synaptic weight device of claim 10, wherein the resistive switching layer including the plurality of cross-point nodes comprises $SiO_2$.

12. The multi-level synaptic weight device of claim 5, wherein each of the plurality of horizontal conductive lines includes a p-n junction through which a forward current flows in a direction from the horizontal conductive line to the vertical conductive line.

13. The multi-level synaptic weight device of claim 5, wherein, when the horizontal stack structure includes N horizontal conductive lines and when the vertical array structure includes P vertical conductive lines, the number of cross-point nodes that have a conductive path and that are common to an m-th horizontal conductive line on an m-th layer (where 1≤m≤N) is equal to or less than P.

14. The multi-level synaptic weight device of claim 5,
wherein, when an input pulse is applied to one of the plurality of horizontal conductive lines, currents flow in the fixed resistors coupled to the vertical conductive lines that are electrically coupled to the one of the plurality of horizontal conductive lines through cross-point nodes having conductive paths, and
wherein the currents flowing in the fixed resistors are added in the conductive plate and form an output signal.

15. A method for fabricating a multi-level synaptic weight device having a three-dimensional (3D) vertical cross-point structure, comprising:
forming an insulating layer and a conductive layer over the insulating layer, the conductive layer partitioned into a first conductive region and a second conductive region, each of which have substantially the same width and substantially the same linear shape, that are alternately placed in a fixed direction;
forming a stack structure having N insulating layers and N conductive layers by repeating the forming the insulating layer and the conductive layer N times;
etching the stack structure to form multiple horizontal insulating layers and multiple horizontal conductive lines, each of the multiple horizontal conductive lines having a linear p-n junction formed by the first conductive region and the second conductive region;
forming resistive switching layers on opposite sidewalls of a gap formed by etching the stack structure;
filling a gap between the resistive switching layers with a vertical conductive layer;
forming multiple vertical conductive lines by etching portions of the vertical conductive layer;
forming multiple vertical insulating layers between the vertical conductive lines;
forming an upper insulating layer over the multiple vertical conductive lines and the vertical insulating layer; and
forming gaps that expose the multiple vertical conductive lines by vertically etching the upper insulating layer in regions common to the vertical conductive lines, and
forming fixed resistors in the gaps formed in the upper insulating layer.

16. The method of claim 15, wherein the first conductive region comprises an n-type polysilicon material, and the second conductive region comprises a p+-type polysilicon material.

17. The method of claim 15, wherein the fixed resistor is a resistor device having a predetermined resistance value.

18. The method of claim 15, wherein the forming of the insulating layer and the conductive layer further comprises:
stacking a polysilicon layer over the insulating layer; and
partitioning the polysilicon layer into substantially linear regions having substantially the same width, and implanting ions in the linear regions, to form alternating n-type polysilicon regions and p+-type polysilicon regions.

19. The method of claim 16, wherein the forming of the multiple horizontal conductive lines and the multiple horizontal insulating layers further comprises:
performing etching to remove a portion of one of the n-type polysilicon regions or one of the p+-type polysilicon regions.

20. The method of claim 17, wherein the resistive switching layer includes $SiO_2$, $NiO_x$, or a phase change material.

* * * * *